United States Patent
Lin et al.

[11] Patent Number: 6,060,374
[45] Date of Patent: May 9, 2000

[54] MONITOR FOR MOLECULAR NITROGEN DURING SILICON IMPLANT

[75] Inventors: Cheng-Kun Lin; Szu-An Wu, both of Hsin-chu, Taiwan

[73] Assignee: Taiwan Semiconductor Manufacturing Company, Hsin-Chu, Taiwan

[21] Appl. No.: 09/090,614

[22] Filed: Jun. 4, 1998

[51] Int. Cl.[7] .................................................. H01L 21/425
[52] U.S. Cl. ............................................. 438/514; 438/16
[58] Field of Search .............................. 438/16, 17, 514, 438/515, 516, 528, 530, 920

[56] References Cited

U.S. PATENT DOCUMENTS

| | | | |
|---|---|---|---|
| 5,223,443 | 6/1993 | Chinn et al. | 437/8 |
| 5,604,350 | 2/1997 | Chu | 250/426 |
| 5,880,013 | 3/1999 | Yang et al. | 438/514 |
| 5,904,552 | 5/1999 | Shiralagi et al. | 438/514 |

*Primary Examiner*—Chandra Chaudhari
*Attorney, Agent, or Firm*—George O. Saile; Stephen B. Ackerman

[57] ABSTRACT

Measurement of contaminating nitrogen during silicon ion implantation has been achieved by including a silicon wafer as a monitor in the implantation chamber. After silicon ion implantation, the monitor is subjected to a rapid thermal oxidation (about 1,100° C. for one minute) and the thickness of the resulting grown oxide layer is measured. The thinner the oxide layer (relative to an oxide layer grown on pure silicon) the greater the degree of nitrogen contamination. For example, a reduction in oxide thickness of about 30 Angstroms corresponds to a nitrogen dosage of about $10^{13}$ atoms/sq. cm. By measuring total ion dosage during implantation and then subtracting the measured nitrogen dosage, the corrected silicon dosage may also be computed.

19 Claims, 1 Drawing Sheet

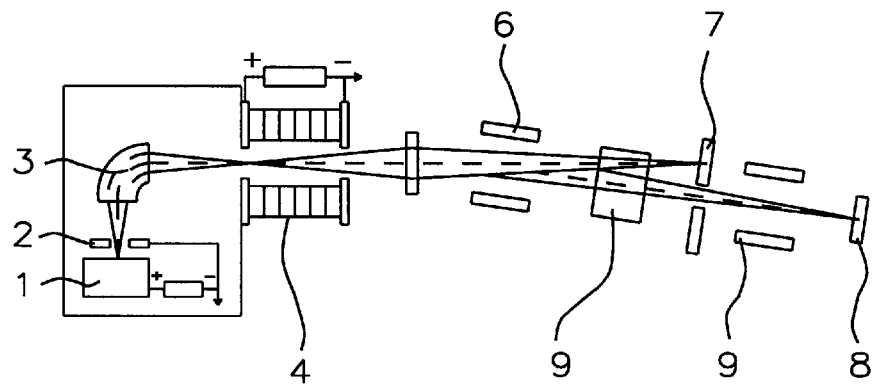
*FIG. 1 - Prior Art*
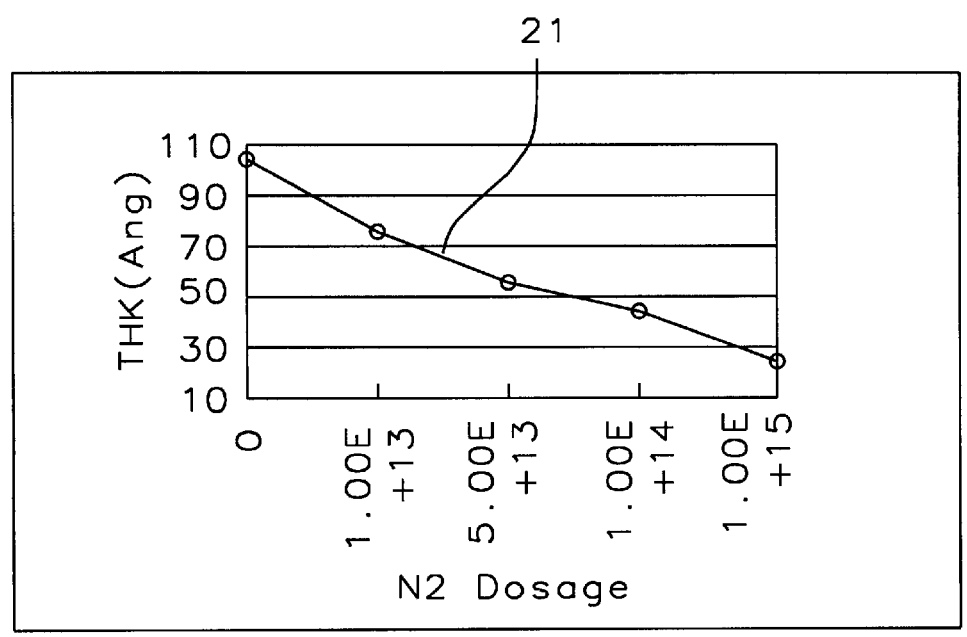
*FIG. 2*

MONITOR FOR MOLECULAR NITROGEN DURING SILICON IMPLANT

BACKGROUND OF THE INVENTION (1) Field of the Invention

The invention relates to the general field of ion implantation, more particularly to the measurement of ion dosages, and specifically to implanted nitrogen and silicon.

(2) Description of the Prior Art

Ion implantation is widely used as a method for introducing foreign material into semiconductors during the manufacture of integrated circuits. Most commonly, the foreign atoms that are inserted into the semiconductor are dopants such as (for silicon) arsenic, phosphorus, and boron.

In recent years, as the critical dimensions of integrated circuits (ICs) continue to shrink, a need has arisen for the implantation of additional silicon atoms into certain parts of the ICs. This is a side effect of the salicide (Self aligned silicide) process wherein a conductive layer of a material such as titanium silicide is selectively formed only on silicon surfaces. The process depends on the fact that wherever the (titanium) metal is in direct contact with silicon it will, on heating, react to form the silicide, metal elsewhere remaining unchanged. Thus, following the heat treatment, all unreacted metal gets removed and only the original silicon surface retains a conductive overcoat.

Since the silicidation reaction consumes a certain amount of silicon at the metal-silicon interface, there arises the possibility that very thin layers will be fully consumed and shorted through. To prevent this, additional silicon needs to be added to the areas that will be affected (in practice, all source, drain, and gate electrode areas) by the silicidation. Ion implantation is the preferred technique for accomplishing this because it is simple, cheap, and uniformity is easy to control.

FIG. 1 is an illustration of a typical ion implantation apparatus of the type used in the IC industry. See, for example, Chu (U.S. Pat. No. 5,604,350 Febuary 1997). The ion species that is to be implanted is introduced into ion source chamber 1 as an elemental gas or as part of a gaseous compound. Silicon ions are most commonly generated from silicon tetrafluoride which dissociates inside chamber 1 into fluorine and silicon ions.

All ions that are formed in chamber 1 are extracted through gate 2 so that they pass through analyzing magnet 3 which allows only ions having the intended atomic mass to pass into acceleration tube 4 where the selected ions acquire the high voltage needed for effective ion implantation. After the ion beam has been focussed it is electrically diverted at 6 so that any neutral species in the beam get removed at 7. Finally, the focussed ion beam is directed at silicon wafer 8. Since the focus area of the beam is small, scanning plates 9 are also provided to allow the ion beam to cover larger areas. Also included with the wafer is means for measuring the beam current of the ion beam so that total accumulated ion dosage may be computed.

In the more common applications of ion implantation, the species selected by analyzer 3 are unique so the ion implantation process does not introduce any contaminants. In the case of silicon ions there is a problem with nitrogen as a contaminant because nitrogen, which has an atomic weight of 14, emerges from chamber 1 primarily as ionized nitrogen molecules ($N_2^+$) which have a molecular weight of 28—the same value as the atomic weight of silicon.

Unfortunately, nitrogen has the potential to be a major contaminant in ion implantation systems since they must constantly be exposed to the air during loading and unloading. Time is money in production systems so there is always some uncertainty as to whether or not sufficient time has been allowed for all nitrogen to be removed from the ionization chamber before implantation begins.

SUMMARY OF THE INVENTION

It has been an object of the present invention to provide a method for determining the amount of nitrogen contaminant present with implanted silicon ions.

Another object of the present invention has been that said method not require any modification of currently used methods or apparatus for performing silicon ion implantation.

A still further object has been that the method be capable of detecting nitrogen dosages, in the presence of silicon, as low as $5 \times 10^{12}$/sq. cm.

Yet another object has been that the measurement take only a few minutes to perform.

An additional object has been to provide a method for determining the correct dosage of implanted silicon ions.

These objects have been achieved by including a silicon wafer as a monitor in the implantation chamber. After silicon ion implantation, the monitor is subjected to a rapid thermal oxidation (about 1,100° C. for one minute) and the thickness of the resulting grown oxide layer is measured. The thinner the oxide layer (relative to an oxide layer grown on pure silicon) the greater the degree of nitrogen contamination. For example, a reduction in oxide thickness of about 30 Angstroms corresponds to a nitrogen dosage of about $10^{13}$ atoms/sq. cm. By measuring total ion dosage during implantation and then subtracting the measured nitrogen dosage, the corrected silicon dosage is computed.

BRIEF DESCRIPTION OF THE DRAWINGS

FIG. 1 shows an ion implantation apparatus of the kind typically used in the semiconductor industry.

FIG. 2 is a curve of oxide thickness vs. nitrogen dosage during silicon ion implantation.

DESCRIPTION OF THE PREFERRED EMBODIMENTS

As discussed above, nitrogen contamination during silicon ion implantation represents a serious problem partly because it becomes expensive to always make certain that all residual nitrogen has been removed from the ion implantation equipment, but particularly because most nitrogen ions are formed from undissociated nitrogen molecules having an atomic weight of 28 (which is the same as that of silicon) and so cannot be separated from silicon by the analyzing magnet.

The present invention provides a means for measuring how much nitrogen, if any, was included during silicon implantation. The method is based on our observation that implanted silicon that has been contaminated with nitrogen oxidizes at a slower rate than pure implanted silicon.

In addition to the wafer(s) being processed in the ion implantation chamber, a monitor comprising a silicon wafer is included. For the monitor wafer we have generally used a P-type wafer (as it is cheaper than N-type) having a bulk resistivity of about 30 ohm cm., but any resistivity value between about 5 and 100 ohm cm. would still be acceptable.

The implantation of silicon ions into the process wafer(s) and the monitor is then effected in the normal manner. We have typically used an acceleration voltage of about 30 kV but the method will operate satisfactorily for any ion voltage between about 10 and 60 kV. The current of our ion beam has been about 5 milliamps but any current between about 1 and 8 would be acceptable.

Silicon ion implantation typically lasts about 5 minutes but the method would work successfully for any implantation time in the range from about 1 to 30 minutes. Once the ion current and implantation time are known, an accumulated dosage is readily computed or, preferably, a dosimeter is used to integrate ion current over time. We have typically used silicon implanted doses around $10^{15}$ ions/cm$^2$ but any dose between about $10^{14}$ and $10^{16}$ ions/cm$^2$ would still be compatible with the present invention.

After completion of the silicon ion implantation, the monitor wafer is removed and subjected to rapid thermal oxidation RTO). Typically, RTO is for about 60 seconds at a temperature of about 1,100° C. in oxygen, but any RTO process lasting between about 50 and 70 seconds at a temperature between about 1,080 and 1,150° C. could have been used without diminishing the effectiveness of the method.

The RTO causes a layer of silicon oxide to grow on the surface of the monitor wafer. The thickness of this oxide layer is then carefully measured using an ellipsometer. As noted earlier, we have found a close correlation to exist between the amount of nitrogen contamination in the implanted silicon and the thickness of the oxide layer that is grown after implantation.

FIG. 2 was constructed from data gathered by implanting various silicon layers that had preset levels of nitrogen contamination. Curve 21 shows how the thickness (in Angstroms) of the grown oxide varied with nitrogen dosage (in atoms/sq. cm.). The ion energies were 30 kV and the RTO consisted of 1,100° C. for 60 seconds. The figure covers a nitrogen dosage range between $10^{13}$ and $10^{15}$ but the method is effective for any nitrogen dose between about $5\times10^{12}$ and $10^{16}$ ions/sq. cm. Similarly, the oxide thicknesses used to construct FIG. 2 are between 104 and 24 Angstroms, but the method is effective for any thickness from about 110 to 20 Angstroms.

Thus, given data such as shown in FIG. 2, the amount of nitrogen in any given layer of implanted silicon may be deduced from the thickness of an oxide layer that is subsequently grown on it. For the particular conditions that characterize the data of FIG. 2, a dosage value for the nitrogen contaminant may be obtained. For example, in the absence of nitrogen contamination the oxide thickness would be about 104 Angstroms (see FIG. 2) but for a contamination level of around 1% (corresponding to a nitrogen dosage of about $10^{13}$) the measured thickness would be about 20 Angstroms less (again see FIG. 2). This represents a high level of sensitivity by the present invention since the dosage level of the silicon added through implantation is itself normally controlled only to about 10%. Since 3–6% of this range in control is due to the implanter itself, the detection sensitivity provided by the invention is well below the level above which nitrogen contamination cannot be ignored.

At the completion of the implantation, the nitrogen dose, if any, is determined using the RTO and oxide thickness measurement discussed above. Once the correct-nitrogen dose is known, the correct silicon dosage is readily obtained by subtracting the nitrogen dose from the uncorrected silicon dosage.

While the invention has been particularly shown and described with reference to the preferred embodiments thereof, it will be understood by those skilled in the art that various changes in form and details may be made without departing from the spirit and scope of the invention.

What is claimed is:

1. A method to monitor nitrogen dosage in a process wafer during silicon ion implantation, comprising:

providing a silicon wafer;

placing the process wafer and the silicon wafer in an ion implantation chamber;

simultaneously implanting silicon ions into the process wafer and the silicon wafer, said ions having voltage and an accumulated dosage;

subjecting the silicon wafer to rapid thermal oxidation, thereby growing a layer of silicon oxide on a surface of said silicon wafer;

determining a thickness value for said silicon oxide layer; and computing a dosage value for nitrogen implanted in the silicon wafer from said thickness value.

2. The method of claim 1 wherein the voltage of the silicon ions is between about 10 and 60 kV.

3. The method of claim 1 wherein the accumulated dosage of silicon ions is between about $10^{14}$ and $10^{16}$/sq. cm.

4. The method of claim 1 wherein the silicon wafer is P-type and has a resistivity between about 5 and 100 ohms-cm.

5. The method of claim 1 wherein the computed dosage for nitrogen is between about $5\times10^{12}$ and $1\times10^{16}$/sq. cm.

6. The method of claim 1 wherein the thickness value of the silicon oxide layer is between about 20 and 110 Angstroms.

7. The method of claim 1 wherein the step of determining a thickness value further comprises using ellipsometry.

8. The method of claim 1 wherein the step of subjecting the silicon wafer to rapid thermal oxidation further comprises heating in oxygen for between about 50 and 70 seconds at a temperature between about 1,080 and 1,150° C.

9. A method to measure true silicon dosage in a process wafer during silicon ion implantation, comprising:

providing a silicon wafer;

placing the process wafer and the silicon wafer in an ion implantation chamber;

simultaneously implanting silicon ions into the process wafer and the silicon wafer for a period of time, said ions having voltage, current, and an accumulated dosage;

subjecting the silicon wafer to rapid thermal oxidation, thereby growing a layer of silicon oxide on a surface of said silicon wafer;

determining a thickness value for said silicon oxide layer;

determining an uncorrected dosage value for implanted silicon ions by multiplying said current by said time period;

computing a dosage value for nitrogen implanted in the silicon wafer from said thickness value; and computing the true dosage value for implanted silicon ions by subtracting the dosage value for nitrogen from the uncorrected dosage value for implanted silicon ions.

10. The method of claim 9 wherein the current of silicon ions is between about 1 and 8 milliamps.

11. The method of claim 9 wherein said period of time is between about 1 and 30 minutes.

12. The method of claim 9 wherein the voltage of the silicon ions is between about 10 and 60 kV.

13. The method of claim 9 wherein the uncorrected accumulated dosage of silicon ions is between about $10^{14}$ and $10^{16}$/sq. cm.

14. The method of claim 9 wherein the silicon wafer is P-type and has a resistivity between about 5 and 100 ohms-cm.

15. The method of claim 9 wherein the computed dosage for nitrogen is between about $5\times10^{12}$ and $10^{16}$/sq. cm.

16. The method of claim 9 wherein the thickness value of the silicon oxide layer is between about 20 and 110 Angstroms.

17. The method of claim 9 wherein the step of subjecting the silicon wafer to rapid thermal oxidation further comprises heating in oxygen for between about 50 and 70 seconds at a temperature between about 1,080 and 1,150° C.

18. A method to determine nitrogen contamination levels in a silicon ion beam that is implanted into a silicon wafer, comprising:

providing a silicon wafer known to be free of nitrogen;

implanting ions from said silicon ion beam into the silicon wafer to an accumulated dosage;

subjecting the silicon wafer to rapid thermal oxidation, thereby growing a layer of silicon oxide on a surface of said silicon wafer;

determining a thickness for said silicon oxide layer; and computing the nitrogen contamination level from said oxide thickness.

19. The method of claim 18 wherein said oxide thickness is between about 20 and 110 Angstroms.

* * * * *